US012522254B2

United States Patent
Kobayashi

(10) Patent No.: US 12,522,254 B2
(45) Date of Patent: Jan. 13, 2026

(54) OVERHEAD TRANSPORT VEHICLE SYSTEM

(71) Applicant: MURATA MACHINERY, LTD., Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 508 days.

(21) Appl. No.: 18/119,876

(22) Filed: Mar. 10, 2023

(65) Prior Publication Data
US 2023/0286551 A1  Sep. 14, 2023

(30) Foreign Application Priority Data

Mar. 14, 2022  (JP) .................................. 2022-039457

(51) Int. Cl.
*H01L 21/677* (2006.01)
*B61B 3/00* (2006.01)

(52) U.S. Cl.
CPC ............ *B61B 3/00* (2013.01); *H01L 21/6773* (2013.01); *H01L 21/67733* (2013.01)

(58) Field of Classification Search
CPC ......... B61B 3/02; B61B 3/00; H01L 21/6773; H01L 21/67733
See application file for complete search history.

(56) References Cited

U.S. PATENT DOCUMENTS

| 3,233,556 | A  | * | 2/1966  | Mcdonald  | B61B 3/02      |
|-----------|----|---|---------|-----------|----------------|
|           |    |   |         |           | 104/23.1       |
| 9,758,310 | B2 | * | 9/2017  | Murao     | H01L 21/67736  |
| 9,895,977 | B2 | * | 2/2018  | Wada      | B65G 35/06     |
| 10,192,764| B2 | * | 1/2019  | Kobayashi | H01L 21/68707  |
| 10,604,899| B2 | * | 3/2020  | Horii     | B61K 9/08      |
| 10,714,368| B2 | * | 7/2020  | Kobayashi | H01L 21/67736  |
| 10,822,205| B2 | * | 11/2020 | Kobayashi | B66C 11/00     |
| 10,964,573| B2 | * | 3/2021  | Kobayashi | H01L 21/67259  |
| 11,066,284| B2 | * | 7/2021  | Tomida    | H01L 21/67733  |
| 11,084,505| B2 | * | 8/2021  | Kobayashi | B65G 1/0464    |
| 11,276,597| B2 | * | 3/2022  | Kobayashi | H01L 21/67706  |

(Continued)

FOREIGN PATENT DOCUMENTS

| CN | 106012715 A | * | 10/2016 | ............. E01B 25/24 |
| CN | 111891143 A | * | 11/2020 | ................ B61F 5/52 |

(Continued)

*Primary Examiner* — Paul N Dickson
*Assistant Examiner* — Maxwell L Meshaka
(74) *Attorney, Agent, or Firm* — Keating & Bennett, LLP

(57) ABSTRACT

An overhead transport vehicle system includes an overhead transport vehicle including a traveler and a body supported by the traveler via a suspension to hold an object to be transported, and a traveling rail including a slit, through which the suspension is movable when the traveler travels, and rolling portions along which traveling wheel rolls, and having a tubular shape including an internal space through which the traveler travels. In the internal space in a curved section, above a passing area through which the traveling wheel rolling on the rolling portion on an outer side of a curve passes, a rising restriction portion, with which the traveling wheel having risen by a predetermined amount from the rolling portion comes into contact, extends along an extending direction of the traveling rail.

2 Claims, 5 Drawing Sheets

(56) References Cited

U.S. PATENT DOCUMENTS

| | | | |
|---|---|---|---|
| 11,474,143 B2* | 10/2022 | Kobayashi | H01L 21/6773 |
| 11,858,539 B2* | 1/2024 | Kobayashi | H01L 21/6773 |
| 11,891,245 B2* | 2/2024 | Wada | H01L 21/67736 |
| 11,961,751 B2* | 4/2024 | Kobayashi | F16F 15/085 |
| 12,057,338 B2* | 8/2024 | Kobayashi | B66C 1/445 |
| 12,084,093 B2* | 9/2024 | Otsuka | B61C 13/00 |
| 12,106,990 B2* | 10/2024 | Kobayashi | B25J 15/009 |
| 12,110,188 B2* | 10/2024 | Kobayashi | G05D 1/02 |
| 12,139,176 B2* | 11/2024 | Kobayashi | B66C 13/04 |
| 12,208,963 B2* | 1/2025 | Han | B65G 47/48 |
| 12,286,296 B2* | 4/2025 | Kobayashi | B65G 1/0464 |
| 12,351,405 B2* | 7/2025 | Kobayashi | B65G 47/90 |
| 12,406,868 B2* | 9/2025 | Kobayashi | B65G 1/0457 |
| 2014/0144859 A1 | 5/2014 | Fujiwara et al. | |
| 2016/0332523 A1* | 11/2016 | Wada | B61B 3/02 |
| 2017/0197795 A1* | 7/2017 | Murao | H01L 21/67706 |
| 2017/0243775 A1* | 8/2017 | Kobayashi | H01L 21/67369 |
| 2018/0100274 A1* | 4/2018 | Horii | B61K 9/08 |
| 2019/0016574 A1* | 1/2019 | Tomida | H01L 21/67736 |
| 2019/0241406 A1* | 8/2019 | Kobayashi | B65G 1/04 |
| 2020/0013652 A1* | 1/2020 | Kobayashi | B66C 19/00 |
| 2020/0020559 A1* | 1/2020 | Kobayashi | H01L 21/67766 |
| 2020/0182923 A1* | 6/2020 | Kobayashi | H01L 21/67253 |
| 2020/0223455 A1* | 7/2020 | Kobayashi | B65G 1/0464 |
| 2020/0269882 A1* | 8/2020 | Kobayashi | B65G 1/0457 |
| 2020/0331503 A1* | 10/2020 | Kobayashi | H01L 21/677 |
| 2021/0292089 A1* | 9/2021 | Han | B65G 47/48 |
| 2022/0041189 A1* | 2/2022 | Otsuka | B61C 13/00 |
| 2022/0144557 A1* | 5/2022 | Kobayashi | G05D 1/02 |
| 2022/0157630 A1* | 5/2022 | Kobayashi | B66C 19/00 |
| 2022/0324494 A1* | 10/2022 | Atake | B61B 3/02 |
| 2022/0402694 A1* | 12/2022 | Kobayashi | B66C 13/04 |
| 2022/0415686 A1* | 12/2022 | Kobayashi | B65G 1/04 |
| 2023/0134312 A1* | 5/2023 | Kobayashi | H01L 21/67379 198/803.7 |
| 2023/0140218 A1* | 5/2023 | Kobayashi | H01L 21/67379 414/814 |
| 2023/0286551 A1* | 9/2023 | Kobayashi | H01L 21/67733 |
| 2023/0294917 A1* | 9/2023 | Kobayashi | H01L 21/67733 414/729 |
| 2023/0365332 A1* | 11/2023 | Wada | B61B 3/02 |
| 2023/0416018 A1* | 12/2023 | Kobayashi | H01L 21/67733 |
| 2024/0002148 A1* | 1/2024 | Kobayashi | B61B 3/02 |
| 2024/0116545 A1* | 4/2024 | Jaegle | B61F 9/00 |
| 2024/0300736 A1* | 9/2024 | Kobayashi | B65G 1/0464 |
| 2024/0351782 A1* | 10/2024 | Kobayashi | H01L 21/677 |
| 2024/0353213 A1* | 10/2024 | Kobayashi | B61B 13/06 |
| 2024/0375690 A1* | 11/2024 | Kobayashi | B65G 47/61 |
| 2025/0022735 A1* | 1/2025 | Kobayashi | B61B 3/02 |
| 2025/0229810 A1* | 7/2025 | Kobayashi | B65G 1/00 |

FOREIGN PATENT DOCUMENTS

| | | | | |
|---|---|---|---|---|
| CN | 112519804 A | * | 3/2021 | B61B 13/08 |
| CN | 115339475 A | * | 11/2022 | B61F 19/04 |
| JP | 6481174 B2 | | 3/2019 | |
| KR | 10-2014-0141827 A | | 12/2014 | |
| KR | 10-2022-0023395 A | | 3/2022 | |
| KR | 20230099556 A | * | 7/2023 | H01L 21/6773 |
| WO | WO-9520704 A1 | * | 8/1995 | B61B 3/02 |
| WO | 2012/157319 A1 | | 11/2012 | |
| WO | WO-2021074230 A1 | * | 4/2021 | B61B 3/02 |
| WO | WO-2023140019 A1 | * | 7/2023 | B61B 3/02 |
| WO | WO-2023218818 A1 | * | 11/2023 | H01L 21/67715 |

\* cited by examiner

OVERHEAD TRANSPORT VEHICLE SYSTEM

CROSS REFERENCE TO RELATED APPLICATIONS

This application claims the benefit of priority to Japanese Patent Application No. 2022-039457 filed on Mar. 14, 2022. The entire contents of this application are hereby incorporated herein by reference.

BACKGROUND OF THE INVENTION

1. Field of the Invention

An aspect of the present invention relates to an overhead transport vehicle system.

2. Description of the Related Art

Overhead transport vehicles configured to travel along traveling rails installed on ceilings or the like of factories and other buildings are known. For example, International Publication No. WO 2012/157319 discloses an overhead transport vehicle including a traveling unit configured to travel on a traveling rail and a body unit configured to hold an article. In the overhead transport vehicle described in International Publication No. WO 2012/157319, the traveling unit travels inside a tube of the traveling rail formed in a rectangular tubular shape, and the body unit is suspended from and supported by the traveling unit through a slit formed in a bottom portion of the traveling rail.

SUMMARY OF THE INVENTION

In the overhead transport vehicle thus configured, a centrifugal force acting when it travels in a curved section may cause traveling wheels of the traveling unit to rise, thereby causing the traveling unit to tilt. In this case, each component of the traveling unit may collide with the traveling rail, possibly damaging the component of the traveling unit.

Preferred embodiments of the present invention provide overhead transport vehicle systems that can each suppress the amount of rising of traveling wheels when a traveler (traveling unit) travels in a curved section.

An overhead transport vehicle system according to an aspect of a preferred embodiment of the present invention includes an overhead transport vehicle including a traveler and a body, the traveler including a traveling wheel, the body being supported by the traveler via a suspension to hold an object to be transported, and a traveling rail including a slit through which the suspension is movable when the traveler travels, and a rolling portion along which the traveling wheel rolls, and having a tubular shape with an internal space through which the traveler travels. the internal space of the traveling rail in a curved section is provided with a rising restriction portion along an extending direction of the traveling rail above a passing area through which the traveling wheel rolling on the rolling portion on an outer side of a curve passes, the rising restriction portion having a structure such that the traveling wheel having risen by a predetermined amount from the rolling portion comes into contact therewith.

In the overhead transport vehicle system thus configured, the rising restriction portion, with which the traveling wheel on the outer side of the curve comes into contact after having risen by the predetermined amount from the rolling portion, is in the internal space of the traveling rail in the curved section along the extending direction of the traveling rail. This prevents the traveling wheel on the outer side of the curve from rising more than the predetermined amount from the rolling portion in the curved section. Thus, the amount of rising of the traveling wheel can be suppressed when the traveler travels in the curved section.

In an overhead transport vehicle system according to an aspect of a preferred embodiment of the present invention, the traveling rail may include a side portion intersecting the rolling portion, and the rising restriction portion may protrude from the side portion toward the internal space. In this configuration, the side portion of the traveling rail can be used to easily define the rising restriction portion.

In an overhead transport vehicle system according to an aspect of a preferred embodiment of the present invention, the overhead transport vehicle may further include a branching roller used to branch at a branching point of the traveling rail. The branching roller of the overhead transport vehicle traveling on the traveling rail and the rising restriction portion may be provided opposite to each other in a width direction perpendicular or substantially perpendicular to both the extending direction of the traveling rail and a vertical direction. The rising restriction portion may include an end surface facing the branching roller. The internal space in a straight section is provided with a tapered surface connecting the end surface and the side portion in plan view when viewed from the vertical direction. In this configuration, even if the branching roller of the overhead transport vehicle reaches an entrance of the curved section while being positioned outer than the end surface of the rising restriction portion in plan view, the branching roller is smoothly guided to the end surface of the rising restriction portion by the tapered surface without colliding with an end of the rising restriction portion in the extending direction. This can prevent damage to at least one of the branching roller and the rising restriction portion.

In an overhead transport vehicle system according to an aspect of a preferred embodiment of the present invention, the overhead transport vehicle may include a controller configured or programmed to control each component of the traveler, the branching roller may be movable in the width direction, and the controller may control the branching roller to move to an inner side of the curve in the width direction before or simultaneously when the traveler enters the curved section. This configuration can more reliably prevent at least one of the branching roller and the rising restriction portion from being damaged by collision between the branching roller and the rising restriction portion.

According to an aspect of a preferred embodiment of the present invention, the amount of rising of the traveling wheel when the traveler travels on the curved section can be suppressed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
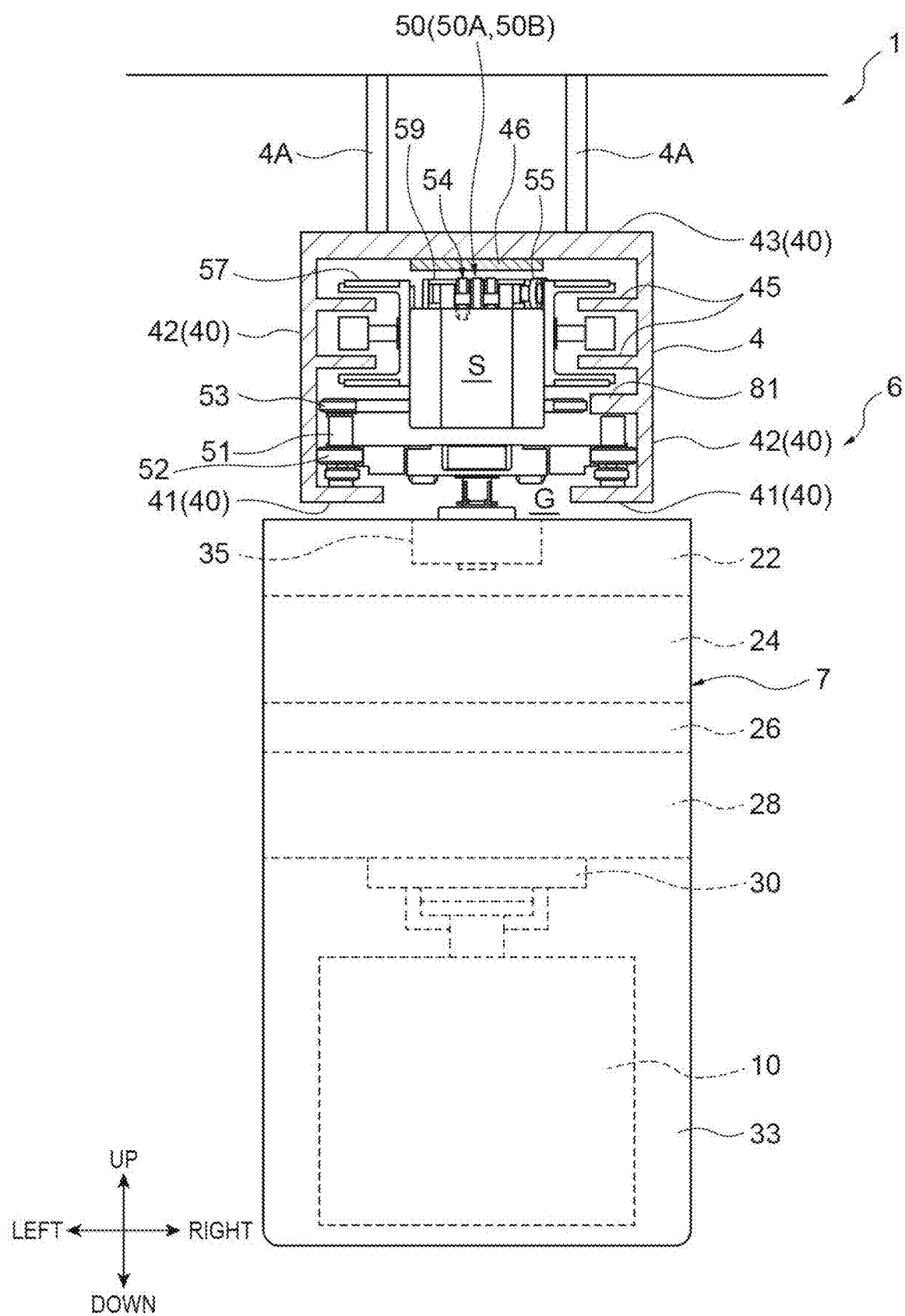
FIG. 2 is a front view of an overhead transport vehicle in FIG. 1 when viewed from the front.
Figure 3:
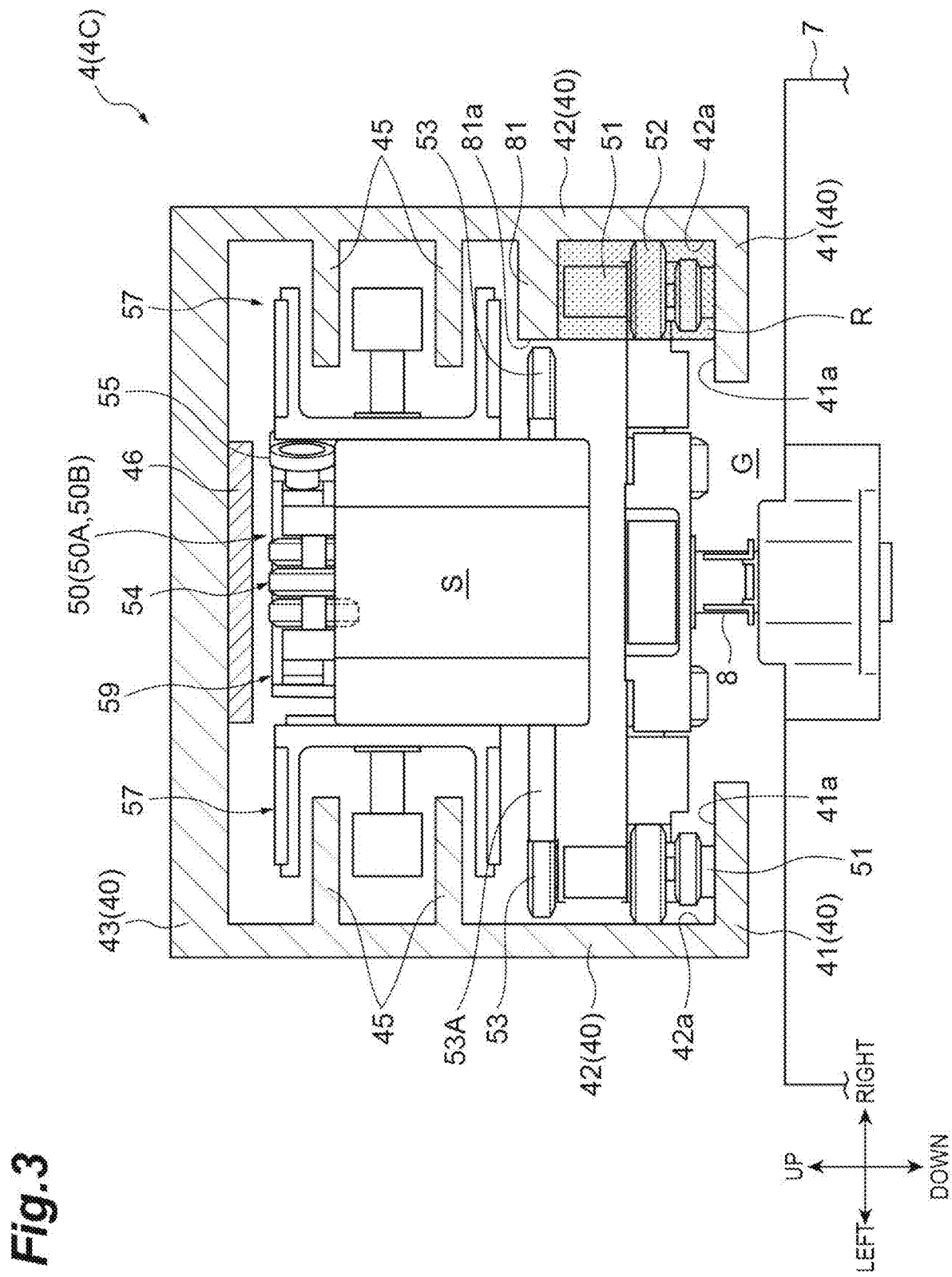
FIG. 3 is a sectional view illustrating a portion of a traveling rail in FIG. 2 in an enlarged manner.

Preferred embodiments according to the present invention will now be described in detail with reference to the drawings. In description of the drawings, like elements are designated by like reference signs, and duplicate description is omitted. In FIG. 2 and FIG. 3, the "up", "down", "left", "right", "front", and "rear" directions are defined for convenience of explanation.

Figure 1:
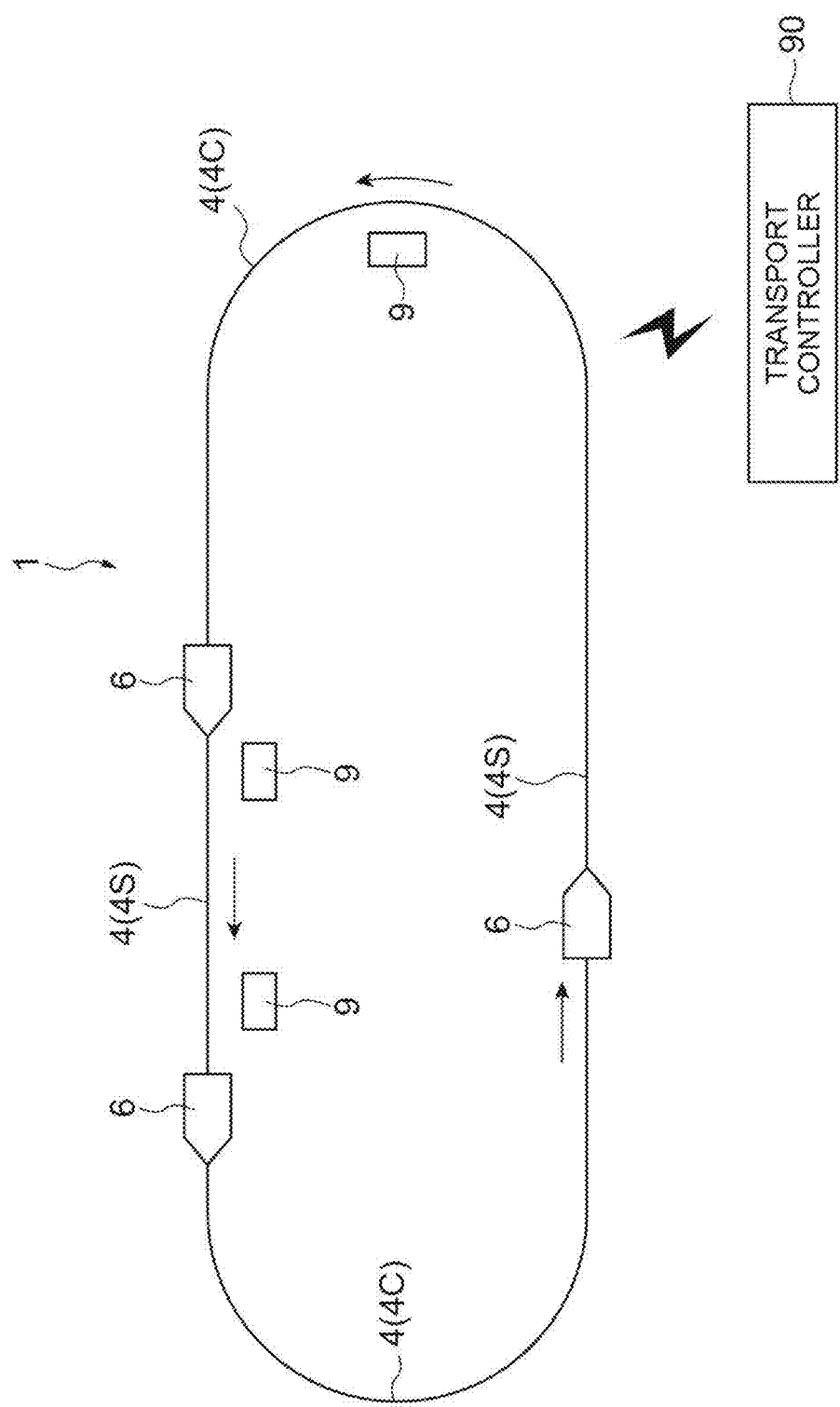
FIG. 1 is a schematic diagram of a configuration of an overhead transport vehicle system according to a preferred embodiment of the present invention.

As illustrated in FIG. 1 and FIG. 2, an overhead transport vehicle system 1 is a system that uses overhead transport vehicles 6 (hereinafter, referred to as "transport vehicle 6") movable along a traveling rail 4 to transport an article (object to be transported) 10 between placement units 9. Examples of the article 10 include containers such as a front opening unified pod (FOUP) configured to store a plurality of semiconductor wafers and a reticle pod configured to store glass substrates, and also include general components. The overhead transport vehicle system 1 includes the traveling rail 4, the plurality of transport vehicles 6, and the plurality of placement units 9.

As illustrated in FIG. 1, the placement units 9 are disposed along the traveling rail 4, and are provided at positions where each transport vehicle 6 can deliver or receive the article 10. Each placement unit 9 includes a buffer and a delivery port. The buffer is a placement unit on which the article 10 is temporarily placed. For example, the buffer is a placement unit on which the article 10 being carried by the transport vehicle 6 is temporarily put when the article 10 cannot be transferred onto the delivery port as a destination for the reason that, for example, another article 10 has been placed on the delivery port. The delivery port is a placement unit to deliver and receive the article 10 to and from a semiconductor processing device (not illustrated) including cleaning equipment, deposition equipment, lithography equipment, etching equipment, thermal treatment equipment, and planarization equipment. Herein, the processing device is not limited to a particular one, and may be a device of various types.

For example, the placement unit 9 is disposed beside the traveling rail 4. In this case, each transport vehicle 6 laterally feeds a lifting drive unit 28, for example, with a cross-feed unit 24 and raises and lowers a lifting platform 30, thereby delivering and receiving the article 10 to and from the placement unit 9. Although not illustrated, the placement unit 9 may be disposed directly below the traveling rail 4. In this case, the transport vehicle 6 raises and lowers the lifting platform 30, thereby delivering and receiving the article 10 to and from the placement unit 9.

The traveling rail 4 is installed near the ceiling in a space overhead of an operator, for example. The traveling rail 4 is suspended from the ceiling, for example. The traveling rail 4 is a predetermined traveling path for the transport vehicles 6 to travel. The transport vehicles 6 move along the traveling rail 4 in one predetermined direction. The traveling rail 4 is supported by posts 4A and 4A.

As illustrated in FIG. 2 and FIG. 3, the traveling rail 4 includes a rectangular tubular rail body 40 including a pair of bottom portions (rolling portions) 41, 41, a pair of side portions 42, 42, and a top portion 43; power feeders 45; and a magnetic plate 46. The rail body 40 defines an internal space S in which a traveling unit 50 of each transport vehicle 6 travels. The bottom portions 41 extend in the traveling direction of the transport vehicle 6 and define the bottom of the rail body 40. The bottom portions 41 are plate-shaped members on which traveling rollers (traveling wheels) 51 of the transport vehicle 6 roll to travel the traveling unit 50. The side portions 42 are formed upright from (intersect) the bottom portions 41. The side portions 42 extend in the traveling direction of the transport vehicle 6 and define the sides of the rail body 40. The top portion 43 extends in the traveling direction of the transport vehicle 6 and defines the top of the rail body 40.

Between the pair of bottom portions 41, 41 opposed in the width direction (left-and-right direction) perpendicular or substantially perpendicular to the extending direction of the traveling rail 4, a slit G is provided, through which a suspending unit 8 of the traveling unit 50 described later in detail passes when traveling. The slit G extends along the extending direction of the traveling rail 4.

The power feeders 45 are configured to supply power to power-feeding cores 57 of the transport vehicle 6 and also transmit and receive signals to and from the power-feeding cores 57. The power feeders 45 are fixed to each of the pair of side portions 42, 42 and extend along the traveling direction. The power feeders 45 provide power to the power-feeding cores 57 in a non-contact manner. The magnetic plate 46 causes a linear DC motor (LDM) 59 of the transport vehicle 6 to generate magnetic force to travel or stop. The magnetic plate 46 is fixed to the top portion 43, and extends along the traveling direction.

Each transport vehicle 6 travels along the traveling rail 4 to transport the article 10. The transport vehicle 6 is configured to be able to transfer the article 10. The transport vehicle 6 is an overhead-traveling automated guided transport vehicle. The number of the transport vehicles 6 that the overhead transport vehicle system 1 includes is not limited to a particular number, and may be two or more. Each transport vehicle 6 includes a body unit 7, the traveling unit 50, and a body controller (control unit) 35. The body unit 7 includes a body frame 22, the cross-feed unit 24, a θ drive 26, the lifting drive unit 28, the lifting platform 30, and a cover 33.

The body frame 22 is connected to the traveling unit 50 with the suspending unit 8, and supports the cross-feed unit 24, the θ drive 26, the lifting drive unit 28, the lifting platform 30, and the cover 33. The cross-feed unit 24 laterally feeds the θ drive 26, the lifting drive unit 28, and the lifting platform 30 all together in the width direction (left-and-right direction) orthogonal to the traveling direction of the traveling rail 4. The θ drive 26 turns at least either one of the lifting drive unit 28 and the lifting platform 30 within a predetermined angle range in a horizontal plane. The lifting drive unit 28 winds or pays out suspending members such as wires, ropes, and belts, thereby raising or lowering the lifting platform 30. The lifting platform 30 is provided with a chuck so as to be able to hold or release the article 10. The cover 33 is provided in a pair on the front and the rear of the transport vehicle 6 in the traveling direction, for example. The covers 33 extend and retract claws (not illustrated), for example, to prevent the article 10 from falling during transport.

Figure 5:
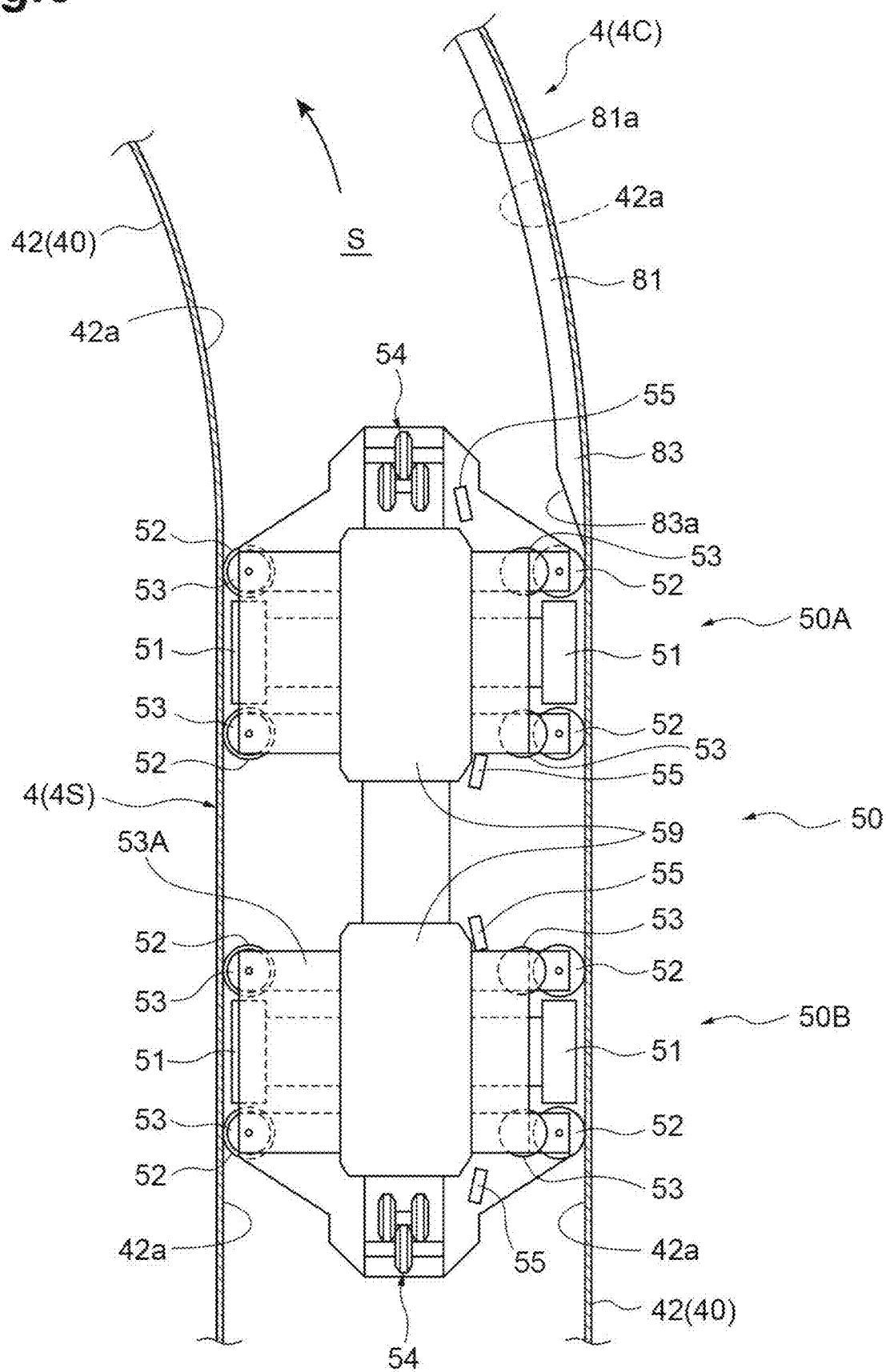
FIG. 5 is a diagram illustrating a traveling unit traveling in an internal space of the traveling rail.

As illustrated in FIG. 3 and FIG. 5, the traveling unit 50 causes the transport vehicle 6 to travel along the traveling rail 4. The traveling unit 50 includes two main units 50A, 50B, and the two main units 50A, 50B are connected to each other. Each of the two main units 50A, 50B includes the traveling rollers 51, side rollers 52, branching rollers 53, auxiliary rollers 54, inclined rollers 55, the power-feeding cores 57, and the LDM 59.

The traveling rollers 51 are disposed at both the left and right ends in the front and the rear of the traveling unit 50. The traveling rollers 51 roll on inner surfaces 41a, 41a of the pair of bottom portions 41, 41 of the rail body 40. The side rollers 52 are disposed so as to sandwich each of the traveling rollers 51 in the front-and-rear direction. The side rollers 52 are capable of being in contact with an inner surfaces 42a of the side portions 42 of the rail body 40.

The branching rollers 53 are disposed so as to sandwich the side rollers 52 from the up-and-down direction. The branching rollers 53 are provided to switch the transport vehicle 6 (traveling unit 50) to travel straight ahead or branch off at branching points of the traveling rail 4. More specifically, the branching rollers 53 switch the traveling direction of the transport vehicle 6 by being selectively guided by guide members provided at the branching points. Four branching rollers 53 are provided to one main unit 50A (50B). The branching rollers 53 are mounted on support members 53A provided in a manner movable in the width direction. The support members 53A move in the width direction when driven by a drive unit. In other words, when the support members 53A move in the width direction, the four branching rollers 53 move together accordingly in the width direction. The driving of the drive unit is controlled by the body controller 35.

The side rollers 52 are provided so as to be able to come into contact with guides (not illustrated) disposed at connections or branches, for example, of the traveling rail 4. The auxiliary rollers 54 preferably include a set of three rollers provided at each of the front and the rear of the traveling unit 50. The auxiliary rollers 54 are provided to prevent the LDM 59 and the power-feeding cores 57, for example, from coming into contact with the magnetic plate 46 disposed on the top portion 43 of the traveling rail 4 when the traveling unit 50 tilts back and forth due to acceleration or deceleration, for example. The inclined rollers 55 are disposed at an angle relative to the front-and-rear direction. The inclined rollers 55 are provided to prevent tilting due to centrifugal force when the traveling unit 50 travels on a curved section.

The power-feeding cores 57 are disposed in the front and the rear of the traveling unit 50 so as to sandwich the LDM 59 in the left-and-right direction. Power is supplied thereto in a non-contact manner from the power feeders 45 disposed on the traveling rail 4, and various signals are transmitted and received therebetween in a non-contact manner. The power-feeding cores 57 exchange signals with the body controller 35. The LDM 59 is provided in each of the front and the rear of the traveling unit 50. The LDM 59 generates, by an electromagnet, magnetic force for traveling or stopping with the magnetic plate 46 disposed on the top portion 43 of the traveling rail 4.

The traveling unit 50 is controlled by a transport controller 90 described later in detail via the body controller 35. Specifically, instructions from the transport controller 90 are transmitted to the body controller 35, and the body controller 35 that has received these instructions controls the traveling unit 50.

The body controller (control unit) 35 is an electronic control unit including a central processing unit (CPU), a read only memory (ROM), and a random access memory (RAM). The body controller 35 controls various operations in the transport vehicle 6. Specifically, the body controller 35 controls the traveling unit 50, the cross-feed unit 24, the θ drive 26, the lifting drive unit 28, and the lifting platform 30. The body controller 35 can be configured, for example, as software such that a program stored in the ROM is loaded into the RAM to be executed by the CPU. The body controller 35 may be configured as hardware such as an electronic circuit. The body controller 35 communicates with the transport controller 90 (see FIG. 1) using the power feeders 45 (feeder wires) or the like of the traveling rail 4.

The transport controller 90 is an electronic control unit including a CPU, a ROM, and a RAM. The transport controller 90 communicates with the body controller 35 by wire or radio, and transmits to the body controller 35 an instruction to cause the transport vehicle 6 to transport an article 10.

Figure 4:
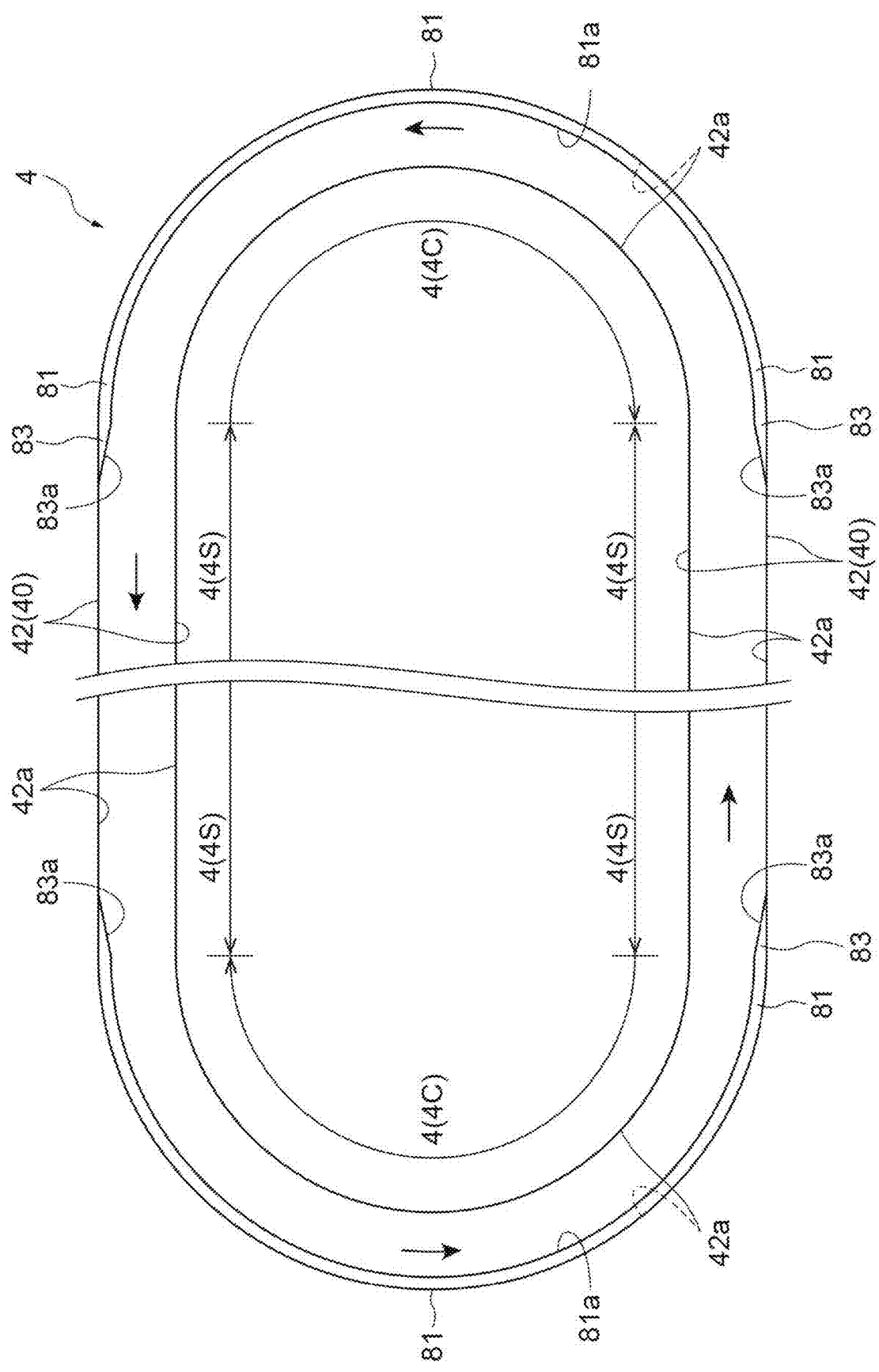
FIG. 4 is a plan view illustrating locations of rising restriction portions.

As illustrated in FIG. 4, the traveling rail 4 includes straight sections 4S and curved sections 4C. As illustrated in FIG. 2 to FIG. 4, in the present preferred embodiment, in the internal space S of the traveling rail 4 in each curved section 4C, below the top portion 43 and above a passing area R through which the traveling roller 51 rolling on the inner surface 41a of the bottom portion 41 on an outer side of a curve passes, a rising restriction portion 81 is disposed along the extending direction of the traveling rail 4. With the rising restriction portion 81, the traveling roller 51 that has risen by a predetermined amount from the bottom portion 41 comes into contact. The rising restriction portion 81 extends from the inner surface 42a of the corresponding side portion 42 as its base end toward the internal space S to its distal end. In other words, the distal end of the rising restriction portion 81 protrudes from the inner surface 42a of the side portion 42 toward the internal space S.

The rising restriction portion 81 may be made of stainless steel, for example, and may be formed integrally with the side portion 42, or may be attached to the side portion 42 with a bracket or the like. The above predetermined amount is set appropriately depending on the state of collision between the traveling rail 4 and each component of the traveling unit 50 with respect to the amount of rising of the traveling roller 51. In other words, if the traveling roller 51 rises but any component of the traveling unit 50 does not collide with the traveling rail 4, the amount of this rising is allowable.

When the pair of side portions 42, 42 defining the traveling rail 4 are viewed in plan view, the outer side of a curve in the traveling rail 4 indicates a side closer to the side portion 42 with a larger curve radius (smaller curvature), and the inner side of the curve in the traveling rail 4 indicates a side closer to the side portion 42 with a smaller curve radius (larger curvature). In the bottom portions 41, the side portions 42, and the top portion 43, surfaces being in contact with the internal space S are called the inner surfaces, and surfaces opposite to the inner surfaces, that is, surfaces being in contact with the external space are called the outer surfaces.

The rising restriction portion 81 is provided opposite, in the width direction, to the corresponding branching rollers 53 of the transport vehicle 6 traveling on the traveling rail 4. The distal end of the rising restriction portion 81 closer to the internal space S is an end surface 81a as illustrated in FIG. 3. The size of the end surface 81a in the vertical direction is larger than the size of the branching rollers 53 in the vertical direction. In other words, the end surface 81a of the rising restriction portion 81 is configured to allow the branching rollers 53 to roll thereon. Tapered portions 83 are disposed at an entrance portion and an exit portion of each curved section 4C (i.e., boundaries into and from the curved section 4C in the straight sections 4S). In the same manner as the rising restriction portion 81, the tapered portions 83 are also attached to the corresponding side portion 42 that defines the traveling rail 4.

Each tapered portion 83 includes a tapered surface 83a that smoothly connects the inner surface 42a of the side portion 42 and the end surface 81a of the rising restriction portion 81. The size of the tapered surface 83a in the vertical direction is larger than the size of the branching rollers 53 in the vertical direction and is substantially the same as that of the end surface 81a. This configuration of the tapered portion 83 allows the branching rollers 53 to roll continuously between the inner surface of the side portion 42 and the tapered surface 83a and the end surface 81a.

In the present preferred embodiment, the body controller 35 controls the branching rollers 53 to move to the inner side of the curve in the width direction (the positions of the branching rollers 53 illustrated in FIG. 5) before or simultaneously when the traveling unit 50 enters the curved section 4C. More specifically, the body controller 35 controls the driving of the drive unit to move the corresponding support member 53A thus moving the branching rollers 53. In the present preferred embodiment, the body controller 35 causes the branching rollers 53 to move in the width direction to the position of the end surface 81a of the rising restriction portion 81 or to an inner position than that of the end surface 81a of the rising restriction portion 81.

The following describes functional effects of the overhead transport vehicle system 1 according to the preferred embodiment described above. In the overhead transport vehicle system 1 according to the above preferred embodiment, the rising restriction portion 81 is disposed in the internal space S of the traveling rail 4 in each curved section 4C. The rising restriction portion 81 is a portion with which the traveling rollers 51 on the outer side of the curve comes into contact after having risen by a predetermined amount from the bottom portion 41, and extends along the extending direction of the traveling rail 4. This prevents the traveling rollers 51 on the outer side of the curve from rising more than the predetermined amount from the bottom portion 41 in the curved section 4C. Thus, the amount of rising of the traveling rollers 51 can be suppressed when the traveling unit 50 travels in the curved section 4C. This can prevent damage to, for example, at least one of the traveling unit 50 (e.g., the LDM 59, the power-feeding cores 57) and the traveling rail 4 (e.g., the power feeders 45, the magnetic plate 46).

In the overhead transport vehicle system 1 according to the above preferred embodiment, the rising restriction portion 81 preferably protrudes from the corresponding side portion 42 toward the internal space S. This allows the side portion 42 of the traveling rail 4 to be used to easily form the rising restriction portion 81.

In the overhead transport vehicle system 1 according to the above preferred embodiment, the branching rollers 53 of the transport vehicle 6 traveling on the traveling rail 4 and the rising restriction portion 81 are provided opposite to each other in the width direction. The rising restriction portion 81 includes the end surface 81a facing the branching rollers 53. In the internal space S in each straight section 4S, the tapered surface 83a connecting the end surface 81a and the side portion 42 in plan view is provided. With this configuration, even if the branching rollers 53 of the transport vehicle 6 reach the entrance of the curved section 4C while being positioned outer than the end surface 81a of the rising restriction portion 81 in plan view, the branching rollers 53 are smoothly guided to the end surface 81a of the rising restriction portion 81 by the tapered surface 83a without colliding with an end of the rising restriction portion 81 in the extending direction. This can prevent damage to at least one of the branching rollers 53 and the rising restriction portion 81.

In the overhead transport vehicle system 1 according to the above preferred embodiment, the body controller 35 may control the branching rollers 53 to move to the inner side of the curve in the width direction before or simultaneously when the traveling unit 50 enters the curved section 4C. This can more reliably prevent at least one of the branching rollers 53 and the rising restriction portion 81 from being damaged by collision between the branching rollers 53 and the rising restriction portion 81.

Although preferred embodiments of the present invention have been described above, the present invention is not limited to the preferred embodiments described above. Various modifications may be made without departing from the gist of the present invention.

In the above preferred embodiments, examples have been described in which rolling surfaces on which the traveling rollers 51 roll are configured as the bottom portions 41 of the traveling rail 4. However, the present invention is not limited to this. The rolling surfaces on which the traveling roller 51 roll may be formed separately and located above the bottom of the traveling rail 4.

In the preferred embodiments and the modifications described above, examples have been described in which the branching rollers 53 are moved in the width direction before the transport vehicle 6 enters the curved section 4C. However, such control is not absolutely necessary, or the transport vehicle 6 does not necessarily include the branching rollers 53.

In the preferred embodiments and the modifications described above, examples have been described in which the rising restriction portion 81 is attached to the side portion 42 of the traveling rail 4. However, the present invention is not limited to this. For example, the rising restriction portion 81 only needs to have a configuration of being provided above the passing area R through which the traveling roller 51 rolling on the inner surface 41a of the bottom portion 41 on the outer side of the curve passes and, for example, may be suspended from the top portion 43 or the like of the traveling rail 4.

In the preferred embodiments and the modifications described above, examples have been described in which the rising restriction portion 81 is provided above the passing area R through which the traveling roller 51 rolling on the inner surface 41a of the bottom portion 41 on the outer side of the curve passes. However, in addition to this configuration, the rising restriction portion 81 may be provided also above a passing area through which the traveling roller 51 rolling on the inner surface 41a of the bottom portion 41 on the inner side of the curve.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An overhead transport vehicle system comprising:
   an overhead transport vehicle including a traveler and a body, the traveler including a traveling wheel, the body being supported by the traveler via a suspension to hold an object to be transported; and
   a traveling rail including a slit through which the suspension is movable when the traveler travels, and a rolling portion along which the traveling wheel rolls, and having a tubular shape with an internal space through which the traveler travels; wherein the internal space of the traveling rail in a curved section is provided with a rising restriction portion along an extending direction of the traveling rail above a passing area through which the traveling wheel rolling on the rolling portion on an outer side of a curve passes, the rising restriction portion have a structure such that the traveling wheel having risen by a predetermined amount from the rolling portion comes into contact therewith;

the traveling rail includes a side portion intersecting the rolling portion;

the rising restriction portion protrudes from the side portion toward the internal space;

the overhead transport vehicle further includes a branching roller to branch at a branch point of the traveling rail;

the branching roller of the overhead transport vehicle traveling on the traveling rail and the rising restriction portion are opposite to each other in a width direction perpendicular or substantially perpendicular to both the extending direction of the traveling rail and a vertical direction;

the rising restriction portion includes an end surface facing the branching roller; and the internal space in a straight section includes a tapered surface connecting the end surface and the side portion in plan view when viewed from the vertical direction.

2. The overhead transport vehicle system according to claim 1, wherein the overhead transport vehicle includes a controller configured or programmed to control each component of the traveler;

the branching roller is movable in the width direction; and the controller is configured or programmed to control the branching roller to move to an inner side of the curve in the width direction before or simultaneously when the traveler enters the curved section.

* * * * *